(12) United States Patent
Aryanfar et al.

(10) Patent No.: US 9,148,156 B2
(45) Date of Patent: Sep. 29, 2015

(54) PHASE DETECTION CIRCUITS AND METHODS

(75) Inventors: Farshid Aryanfar, Sunnyvale, CA (US); Hae-Chang Lee, Los Altos, CA (US); Carl Werner, Los Gatos, CA (US)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 13/519,302

(22) PCT Filed: Dec. 30, 2010

(86) PCT No.: PCT/US2010/062615
§ 371 (c)(1),
(2), (4) Date: Jun. 26, 2012

(87) PCT Pub. No.: WO2011/090767
PCT Pub. Date: Jul. 28, 2011

(65) Prior Publication Data
US 2012/0306538 A1  Dec. 6, 2012

Related U.S. Application Data

(60) Provisional application No. 61/297,002, filed on Jan. 21, 2010.

(51) Int. Cl.
*G01R 25/00* (2006.01)
*H03D 13/00* (2006.01)
(Continued)

(52) U.S. Cl.
CPC ............... *H03L 7/085* (2013.01); *G01R 25/00* (2013.01); *H03D 13/00* (2013.01); *H03L 7/0816* (2013.01)

(58) Field of Classification Search
CPC ...... H03D 13/00; H03D 13/003; H03L 7/085; H03L 7/093; H03K 5/26; G01R 25/00; G01R 25/005
USPC ............... 327/2, 3, 5, 7, 8, 10, 147, 149, 156, 327/158; 331/25; 375/373, 376
See application file for complete search history.

(56) References Cited

U.S. PATENT DOCUMENTS 4,703,476 A * 10/1987 Howard ..................... 370/491
7,084,717 B2 * 8/2006 Okazaki et al. ............. 333/118
(Continued)

FOREIGN PATENT DOCUMENTS

WO  WO 2011-059842  5/2011

OTHER PUBLICATIONS

Search Report and Written Opinion dated Aug. 11, 2011 re PCT Int'l. Application No. PCT/US2010/062615. 8 Pages.

*Primary Examiner* — Patrick O'Neill
(74) *Attorney, Agent, or Firm* — Fenwick & West LLP (57) ABSTRACT

A phase detector circuit compares the phases of first and second periodic input signals to generate an output signal. The phase detector includes a circuit that makes two different combinations of the first and the second periodic input signals to generate third and fourth periodic signals. This circuit causes the third periodic signal to be based on a first combination of the first periodic signal and the second periodic signal that imparts a first relative phase shift. The circuit causes the fourth periodic signal to be based on a second combination of the first periodic signal and the second periodic signal to provide a different relative phase shift. The phase detector also includes a comparison circuit that compares a measure of the power of the third periodic signal to a measure of the power of the fourth periodic signal to generate the phase comparison output signal.

19 Claims, 9 Drawing Sheets

(51) Int. Cl.
  *H03L 7/085* (2006.01)
  *H03L 7/081* (2006.01)

(56) References Cited

U.S. PATENT DOCUMENTS

| | | | |
|---|---|---|---|
| 7,276,977 B2 * | 10/2007 | Self | 331/11 |
| 7,362,818 B1 * | 4/2008 | Smith et al. | 375/296 |
| 7,388,441 B2 | 6/2008 | Delzer | 331/25 |
| 8,243,855 B2 | 8/2012 | Zarei | |
| 2008/0061838 A1 | 3/2008 | Wang et al. | 327/3 |
| 2009/0002039 A1 | 1/2009 | Yun et al. | 327/158 |
| 2009/0121784 A1 | 5/2009 | Lee et al. | 327/544 |
| 2009/0174447 A1 | 7/2009 | Lee et al. | 327/158 |

* cited by examiner

PHASE DETECTION CIRCUITS AND METHODS

CROSS REFERENCE TO RELATED APPLICATION

This patent application is a U.S. national stage application of international application number PCT/US2010/062615, filed Dec. 30, 2010, which claims the benefit of U.S. provisional patent application 61/297,002, filed Jan. 21, 2010, both of which are incorporated by reference herein in their entireties.

TECHNICAL FIELD

This disclosure relates to electronic circuits, and more particularly, to phase detection circuits and methods.

BACKGROUND

Figure 1:
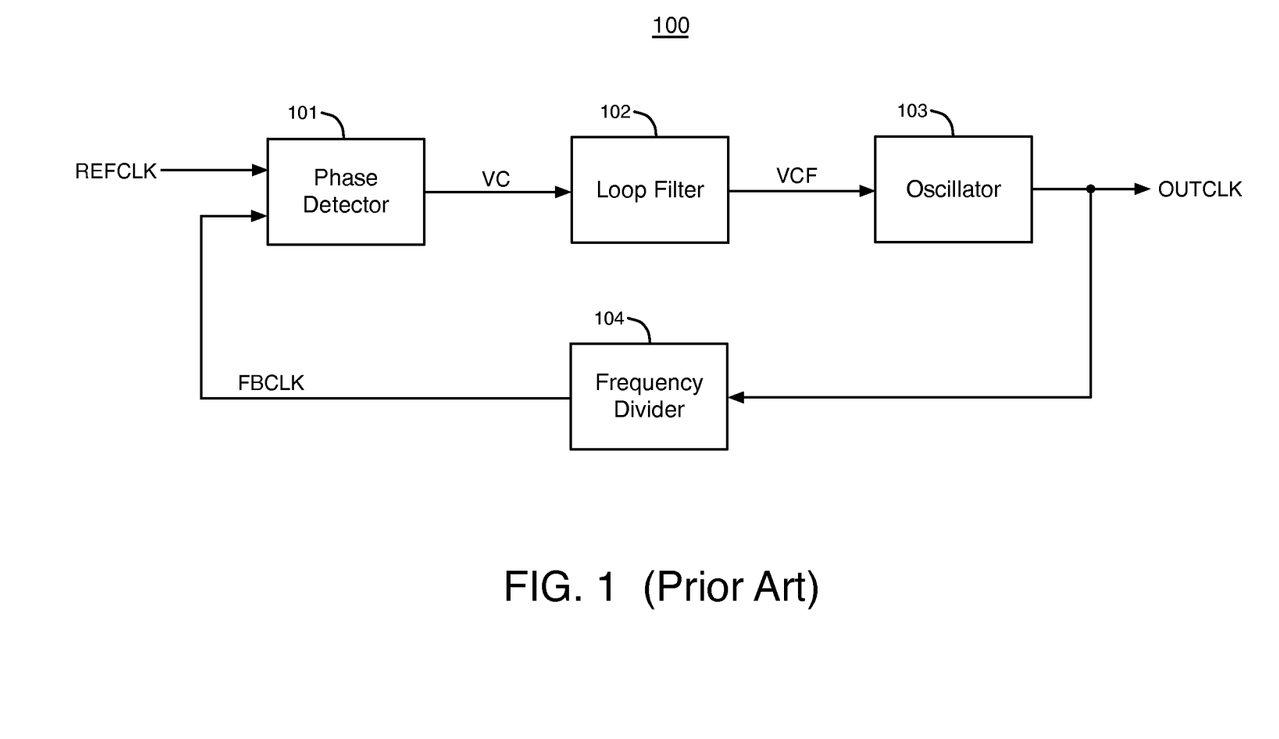
FIG. 1 illustrates a prior art phase-locked loop (PLL).

FIG. 1 illustrates a prior art phase-locked loop (PLL) 100. PLL 100 includes a phase detector circuit 101, a loop filter circuit 102, an oscillator circuit 103, and a frequency divider circuit 104. Phase detector circuit 101 compares the phase of a feedback clock signal FBCLK to the phase of a reference clock signal REFCLK to generate a control signal VC. Loop filter circuit 102 filters control signal VC to generate a filtered control signal VCF. Oscillator circuit 103 generates a periodic output clock signal OUTCLK. Oscillator circuit 103 varies the frequency of OUTCLK based on changes in the filtered control signal VCF.

Frequency divider circuit 104 generates FBCLK in response to OUTCLK. Frequency divider circuit 104 divides the frequency of OUTCLK to generate the frequency of FBCLK. PLL 100 drives the phase difference and the frequency difference between FBCLK and REFCLK to zero.

Frequency divider circuit 104 typically consumes a substantial amount of power in order to generate the feedback clock signal FBCLK in response to a high frequency output clock signal OUTCLK. Frequency divider circuit 104 also generates jitter in OUTCLK. Therefore, it would be desirable to provide a phase-locked loop that generates a high frequency periodic output signal without requiring a frequency divider circuit that consumes a substantial amount of power and that generates jitter.

DETAILED DESCRIPTION

A phase detector circuit combines first and second periodic input signals to generate two different intermediate signals representing different combinations of phase shifted images of the input signals. The phase detector compares power for these two intermediate signals to determine phase difference between the first and second periodic input signals. The phase detector can use a passive circuit, such as a passive hybrid coupler, to generate the two output signals. By using a phase detector circuit of this type in a locked loop, such as a PLL, a low power circuit can be used to generate a timing signal having a specific phase. Such a circuit has a wide variety of applications in digital electronics, including use in low power digital device applications where chips or circuits are to be synchronized with or controlled with respect to a timing reference signal.

Figure 2A:
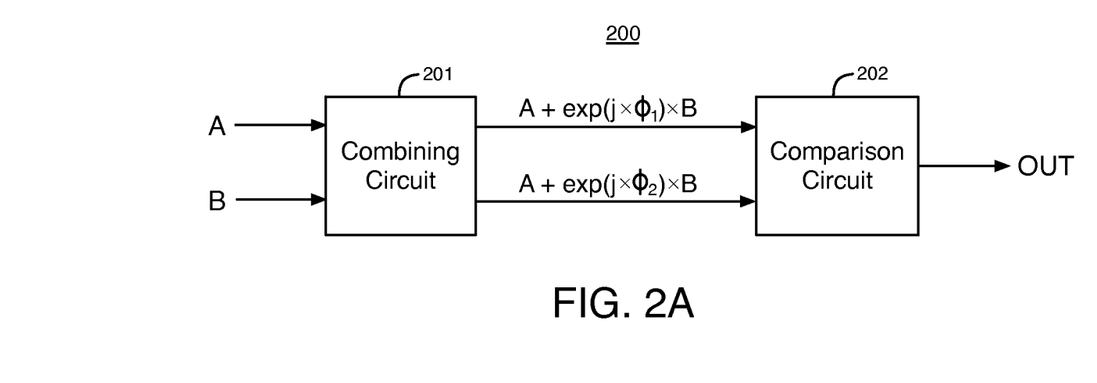
FIG. 2A illustrates an example of a phase detector circuit.
Figure 2B:
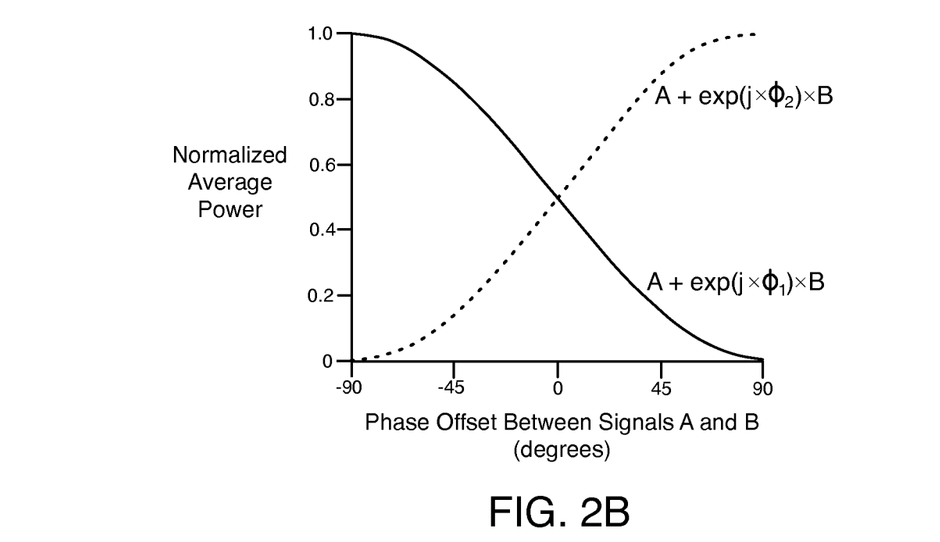
FIG. 2B illustrates an example of the normalized average power for the two signals of the combining circuit of FIG. 2A as a function of the phase difference between the input signals of the combining circuit, when $\phi_1$ and $\phi_2$ are 90 degrees (+j) and 270 degrees (−j), respectively.
Figure 4:
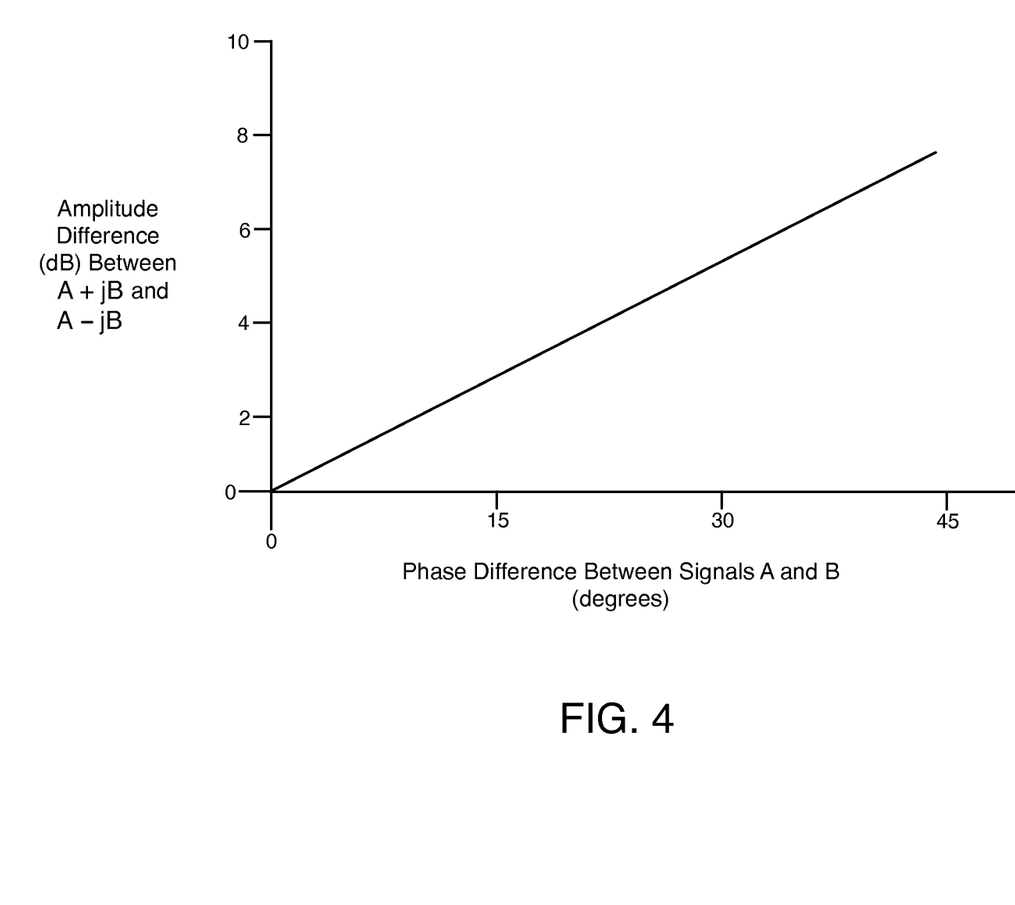
FIG. 4 is a graph that illustrates an example of a plot of the phase difference between the periodic input signals to the passive hybrid coupler of FIG. 2D versus the normalized difference in amplitude between the signals from the passive hybrid coupler in an embodiment in which the signals equal A+jB and A−jB.

FIG. 2A illustrates an example of a phase detector circuit 200. Phase detector circuit 200 compares the phases of two periodic input signals A and B to generate an output signal OUT. The output signal OUT is directly dependent upon the phase difference between the input signals A and B and so may be used to synchronize their relative phases or lock them to a controlled relationship. The phase detector circuit 200 includes a combining circuit 201 that combines the two input signals A and B to generate two intermediate signals that represent different combinations of phase shifted images of the input signals. These two intermediate signals are expressed in FIG. 2A as A+exp(j×$\phi_1$)×B and A+exp(j×$\phi_2$)×B, respectively, although there are alternate ways in which these signals may be combined to impart the relative phase shifts. The two intermediate signals are input to a comparison circuit 202, which generates the output signal OUT. In one embodiment, the comparison circuit takes the difference between these two intermediate signals to generate a difference signal, and the difference signal is then processed to detect peak power (at least for a frequency range). The difference signal will have a maximum peak power when A and B are in phase, and a minimum peak power when A and B are 180 degrees out of phase. Also, for any given phase relationship between the signals A and B, the differences in peak power will be maximized when $\phi_1$ and $\phi_2$ are 180 degrees out of phase. These relationships are illustrated by FIGS. 4 and 2B/2C, respectively.

In the embodiment seen in FIG. 2A, the combining circuit 201 modifies input signals A and B relative to one another to generate two periodic signals that equal $A+\exp(j \times \phi_1) \times B$ and $A+\exp(j \times \phi_2) \times B$, where $j=\sqrt{-1}$. The parameter $\phi_1$ indicates the phase offset that combining circuit 201 generates in periodic signal B relative to periodic signal A to generate an intermediate signal equal to $A+\exp(j \times \phi_1) \times B$. The parameter $\phi_2$ indicates the phase offset that combining circuit 201 generates in periodic signal B relative to periodic signal A to generate an intermediate signal equal to $A+\exp(j \times \phi_2) \times B$. As mentioned, other methods of combining these signals, including other methods of imparting relative phase delays between them, are also possible.

The difference in the power of signals $A+\exp(j \times \phi_1) \times B$ and $A+\exp(j \times \phi_2) \times B$ is proportional to the phase difference between periodic signals A and B while $\phi_1$ and $\phi_2$ are within a particular range. FIG. 2B illustrates an example of the normalized average power for the two intermediate signals from combining circuit 201 as a function of the phase difference between input signals A and B, when $\phi_1$ and $\phi_2$ are 90 degrees (+j) and 270 degrees (−j), respectively. The intermediate signals $A+\exp(j \times \phi_1) \times B$ and $A+\exp(j \times \phi_2) \times B$ from combining circuit 201 are shown as the solid and dotted curves in FIG. 2B, respectively. Combining circuit 201 causes signals $A+\exp(j \times \phi_1) \times B$ and $A+\exp(j \times \phi_2) \times B$ to have the same normalized average power in response to signals A and B being aligned in phase.

Several embodiments, including an embodiment discussed below in connection with FIG. 2D, make use of these principles to facilitate construction of a PLL. For example, the phase detector circuit (block 200 from FIG. 2A) can receive PLL feedback as the signal "B," to be locked to a reference input provided as signal "A". In this case, as mentioned, a combining circuit can be used to induce two different phase-shifted images of signal B relative to signal A, and to produce two different outputs, $A+\exp(j \times \phi_1) \times B$ and $A+\exp(j \times \phi_2) \times B$. The combining circuit from FIG. 2A can be implemented as a passive circuit that produces this combination without being driven by an additional power source, thereby facilitating a low power PLL. In the embodiment of FIG. 2D, this circuit can be further implemented as a "hybrid coupler."

Figure 2C:
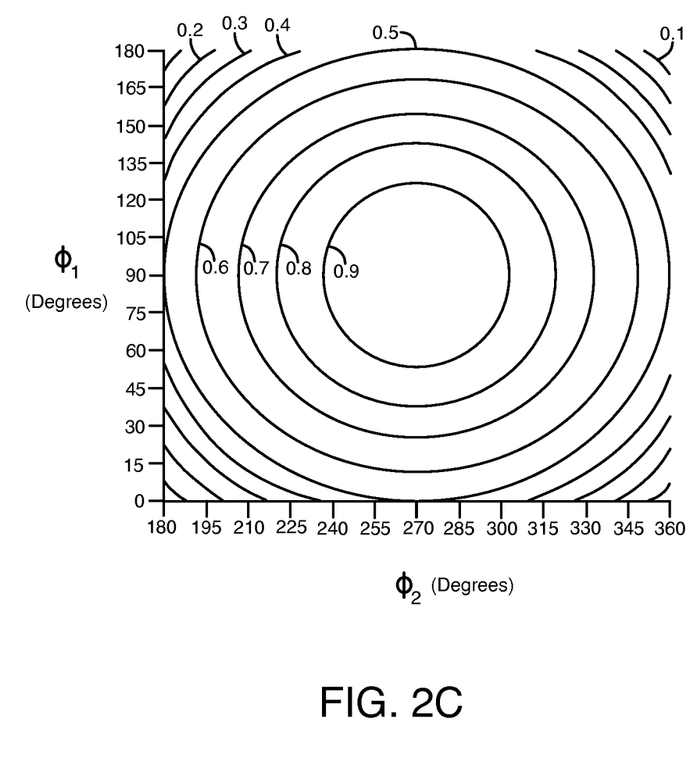
FIG. 2C shows the sensitivity of the phase detector of FIG. 2A for a 90 degrees phase difference between the input signals of the combining circuit by comparing the normalized average power for the two signals from the combining circuit over a range of $\phi_1$ and $\phi_2$.
Figure 2D:
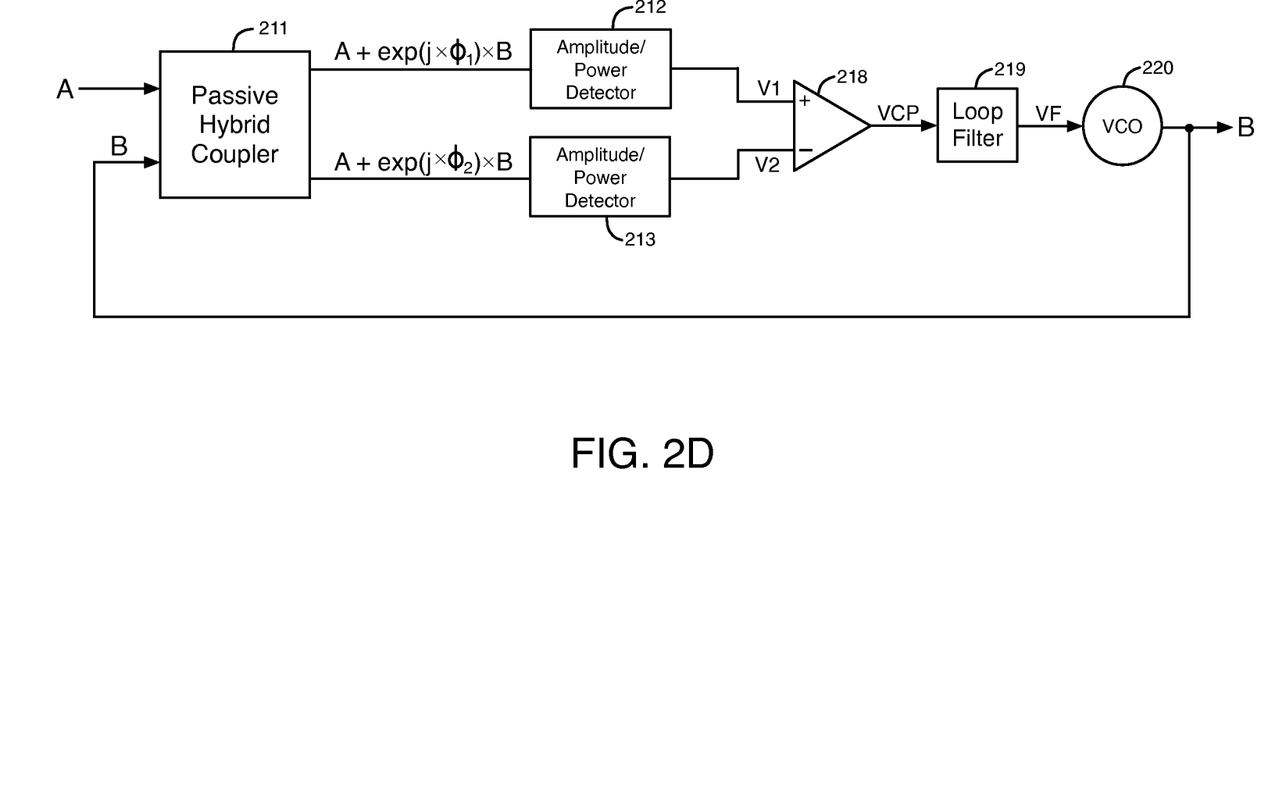
FIG. 2D illustrates an example of a phase-locked loop (PLL) circuit that is capable of generating a high frequency periodic output signal using an embodiment of the phase detector circuit of FIG. 2A.

For a 90 degrees phase difference between input signals A and B, FIG. 2C shows the sensitivity of phase detector 200 by comparing the normalized difference in power between the two intermediate signals output over a range of phases for $\phi_1$ and $\phi_2$. The difference in power between the signals is represented as a normalized value between 0 and 1.0 in FIG. 2C. The nine curves shown in FIG. 2C illustrate the normalized difference in power between the signals from combining circuit 201 at 0.1, 0.2, 0.3, 0.4, 0.5, 0.6, 0.7, 0.8, and 0.9 for a range of phases in $\phi_1$ and $\phi_2$. While the optimum values for $\phi_1$ and $\phi_2$ are 90 degrees and 270 degrees, respectively, as shown in FIG. 2C, phase detector 200 functions over a wide range of values of parameters $\phi_1$ and $\phi_2$.

Comparison circuit 202 compares the power of periodic signal $A+\exp(j \times \phi_1) \times B$ to the power of periodic signal $A+\exp(j \times \phi_2) \times B$ to generate a phase comparison output signal OUT of phase detector circuit 200. The phase comparison output signal OUT of phase detector 200 varies based on changes in the phase difference between periodic input signals A and B.

FIG. 2D illustrates an example of a phase-locked loop (PLL) circuit 210 that is capable of generating a high frequency periodic signal B using an embodiment of the phase detector circuit of FIG. 2A. PLL 210 does not require the use of a frequency divider circuit in the loop path that typically consumes a substantial amount of power and generates jitter in the signal B.

PLL circuit 210 includes a phase detector, a loop filter circuit 219, and a voltage-controlled oscillator (VCO) circuit 220. The phase detector includes a passive hybrid coupler 211, amplitude/power detector circuits 212-213, and comparator circuit 218. The phase detector in PLL circuit 210 is an example of phase detector circuit 200 shown in FIG. 2A.

Two periodic signals A and B are transmitted to inputs of passive hybrid coupler 211 as shown in FIG. 2D. Passive hybrid coupler 211 includes passive circuit components, such as, for example, transmission lines, resistors, capacitors, inductors, or diodes.

Periodic signals A and B can be, for example, clock signals. Passive hybrid coupler 211 combines these two signals in two different manners, to generate two intermediate signals $A+\exp(j \times \phi_1) \times B$ and $A+\exp(j \times \phi_2) \times B$ in response to periodic signals A and B. Intermediate signals $A+\exp(j \times \phi_1) \times B$ and $A+\exp(j \times \phi_2) \times B$ equal two different phase-shifted combinations of signal A with signal B.

Amplitude/power detector circuit 212 generates a voltage signal V1 that is proportional to the power (for example, the peak amplitude) of periodic signal $A+\exp(j \times \phi_1) \times B$. Voltage signal V1 is transmitted to the non-inverting (+) input of comparator 218. Amplitude/power detector circuit 213 generates a voltage signal V2 that is proportional to the power (for example, the peak amplitude) of periodic signal $A+\exp(j \times \phi_2) \times B$. Voltage signal V2 is transmitted to the inverting (−) input of comparator 218.

Comparator circuit 218 compares the voltage of signal V1 to the voltage of signal V2 to generate a phase comparison signal VCP. Comparator circuit 218 is a differencing circuit that generates an analog output voltage signal VCP equal to the linear difference between signals V1 and V2. Alternatively, comparator circuit 218 can, for example, be a digital binary comparator that generates a logic high state in VCP when the voltage of V1 is greater than the voltage of V2, and a logic low state in VCP when the voltage of V2 is greater than the voltage of V1. The output signal VCP of the digital binary comparator may, for example, drive a charge pump circuit to generate an analog signal.

Loop filter circuit 219 generates one or more filtered signals VF that are based on the output signal VCP of comparator circuit 218. If comparator 218 generates an analog output signal VCP, loop filter circuit 219 can include a capacitor that low pass filters signal VCP to generate filtered signal VF. Alternatively, if comparator 218 generates a digital output signal VCP, loop filter circuit 219 can be, for example, an integrator circuit that integrates the digital value of output signal VCP over multiple cycles to generate filtered signals VF.

Voltage-controlled oscillator (VCO) circuit 220 generates an oscillating periodic output voltage signal B. VCO circuit 220 sets the frequency of periodic signal B based on the value(s) of filtered signal(s) VF generated by loop filter circuit 219. VCO circuit 220 varies the frequency of periodic signal B based on changes in filtered signal(s) VF. VCO circuit 220 can be, for example, a ring oscillator, an LC tank oscillator, a crystal oscillator, etc.

A phase difference between periodic signals A and B causes a difference in the relative power (for example, peak amplitudes) of the intermediate signals $A+\exp(j \times \phi_1) \times B$ and $A+\exp(j \times \phi_2) \times B$ output by the passive hybrid coupler 211. Were signals A and B equal in phase, the two intermediate signals would be expected to have identical peak power. With a difference in phase in input signals A and B, the two intermediate signals have different peak power, at least within a specific frequency range. The difference in the power of signals $A+\exp(j\times\phi_1)\times B$ and $A+\exp(j\times\phi_2)\times B$ is proportional to the phase difference between periodic signals A and B. A difference in the power of signals $A+\exp(j\times\phi_1)\times B$ and $A+\exp(j\times\phi_2)\times B$ is reflected as a voltage difference between the signals V1 and V2 generated by the amplitude/power detectors 212-213.

When the periodic signal A is leading the periodic signal B ($\angle A>\angle B$), passive hybrid coupler 211 and amplitude/power detectors 212-213 cause the voltage of signal V1 to be greater than the voltage of signal V2, as shown, for example, in FIG. 2B. In response, comparator 218 increases signal VCP or causes VCP to be in a logic high state, loop filter 219 increases the value of filtered signal(s) VF, and oscillator 220 increases the frequency of periodic signal B.

When the periodic signal A is lagging the periodic signal B ($\angle A<\angle B$), passive hybrid coupler 211 and amplitude/power detectors 212-213 cause the voltage of signal V1 to be less than the voltage of signal V2. In response, comparator 218 decreases signal VCP or causes VCP to be in a logic low state, loop filter 219 decreases the value of filtered signal(s) VF, and oscillator 220 decreases the frequency of periodic signal B.

PLL circuit 210 continues to adjust the phase and the frequency of periodic signal B as previously described, until periodic signals A and B have the same frequency and are aligned in phase, causing PLL 210 to be in lock. Periodic signals A and B are aligned in phase when they have a phase difference of 0° or any multiples of 360°.

In the embodiment of FIG. 2D, passive hybrid coupler 211 does not contain active components such as transistors. As a result, PLL 210 generates a very small skew between signals A and B when PLL 210 is in lock, and PLL 210 generates substantially less jitter in periodic signal B.

As mentioned above, PLL 210 does not require a frequency divider circuit in the loop path between the output of VCO 220 and the second input of passive hybrid coupler 211. As a result, PLL 210 consumes significantly less power than PLL 100 and generates substantially less jitter and phase noise in periodic signal B.

However, according to an alternative embodiment, PLL circuit 210 can have a frequency divider circuit coupled between the output of VCO 220 and the second input of passive hybrid coupler 211. In this embodiment, the frequency divider circuit generates periodic signal B in response to a periodic output signal of VCO 220.

According to yet another alternative embodiment, PLL circuit 210 can have a frequency divider circuit coupled between the reference input, A, of the PLL 210 and the first input of passive hybrid coupler 211.

Figure 3A:
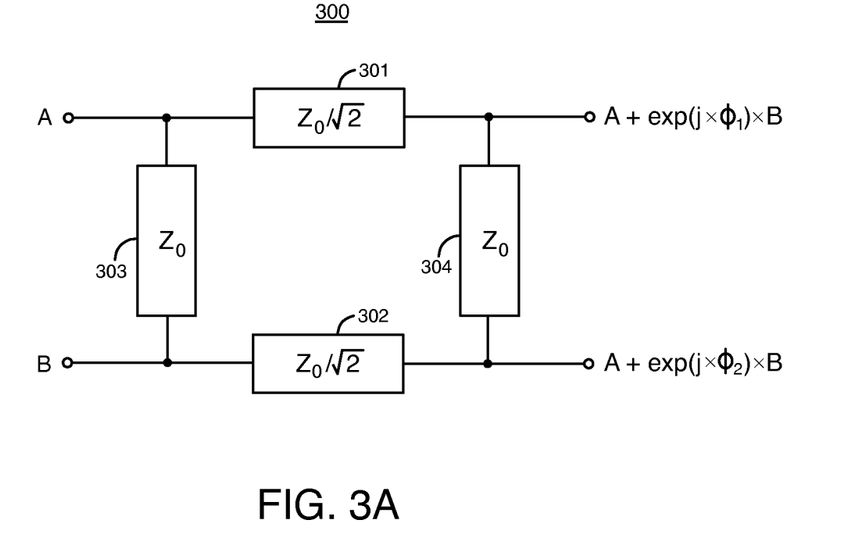
FIG. 3A illustrates an example of a hybrid coupler circuit that can be used to implement the passive hybrid coupler in the PLL of FIG. 2D.

FIG. 3A illustrates an example of a hybrid coupler circuit 300 that can be used to implement passive hybrid coupler 211 in PLL 210. Hybrid coupler circuit 300 includes four transmission lines 301-304 that are coupled in a ring configuration.

The characteristic impedances of transmission lines 301-302 and 303-304 are $Z_0/\sqrt{2}$ and $Z_0$, respectively, where $Z_0$ represents an arbitrary characteristic impedance. The lengths of the transmission lines 301-304 are selected to cause hybrid coupler circuit 300 to generate periodic intermediate signals that equal $A+\exp(j\times\phi_1)\times B$ and $A+\exp(j\times\phi_2)\times B$ in response to periodic signals A and B. Hybrid coupler circuit 300 has a symmetric architecture.

Figure 3B:
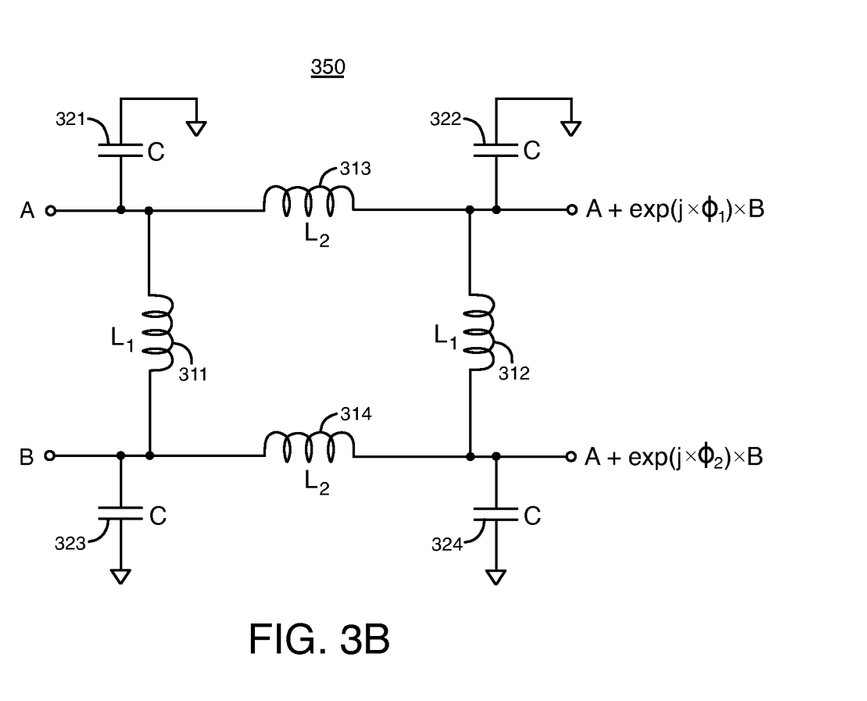
FIG. 3B illustrates an example of an LC circuit that can be used to implement the passive hybrid coupler in the PLL of FIG. 2D.

FIG. 3B illustrates an example of an LC circuit 350 that can be used to implement passive hybrid coupler 211 in PLL 210. LC circuit 350 includes inductors 311-314 that are coupled in a ring configuration and capacitors 321-324. Each of the capacitors 321-324 is coupled between two of the inductors and a ground node.

Inductors 311, 312, 313, and 314 have inductance values of $L_1$, $L_1$, $L_2$, and $L_2$, respectively. Each of the capacitors 321-324 has the same capacitance value, which is represented as C in FIG. 3B. The inductances of inductors 311-314 and the capacitances of capacitors 321-324 are selected to cause LC circuit 350 to generate intermediate signals that equal $A+\exp(j\times\phi_1)\times B$ and $A+\exp(j\times\phi_2)\times B$ in response to periodic signals A and B. LC circuit 350 has a symmetric architecture.

Values for the inductors 311-314 and the capacitors 321-324 can be approximated from the lumped-element equivalent circuits for quarter-wave transmission lines. For example, $L_1=Z_0/W_0$, $C=1/(Z_0\times W_0)$, and $L_2=(Z_0/\sqrt{2})/W_0$, where $W_0=2\pi f_0$, $f_0$ is the design frequency, and $Z_0$ is the characteristic impedance of the transmission line.

According to a specific example in which $\phi_1=90°$ and $\phi_2=270°$, circuits 300 and 350 are designed to generate signals that equal $A+jB$ and $A-jB$. FIG. 4 is a graph that illustrates an example of a plot of the phase difference between periodic signals A and B versus the normalized difference in amplitude between outputs of passive hybrid coupler 211 in an embodiment in which the outputs equal $A+jB$ and $A-jB$. Also in this embodiment, voltage signals V1 and V2 are indicative of the amplitudes of signals $A+jB$ and $A-jB$. As shown in FIG. 4, the peak amplitude difference between signals $A+jB$ and $A-jB$ is about zero when the phase difference between signals A and B is about zero. As the phase difference between signals A and B increases, the peak amplitude difference between these signals also increases.

According to a specific embodiment of FIGS. 2D and 4 that is not intended to be limiting, PLL 210 can, for example, measure the difference between signals $A+jB$ and $A-jB$ within an accuracy of about 10%. In this example, PLL 210 measures less than 1 picosecond (ps) of phase error in periodic signals A and B at a frequency of 10 gigahertz (GHz). At 10 GHz, the period of signals A and B is 100 ps, and a measurement of less than 1 ps of phase error represents less than 1% of the period of A and B.

Figure 5A:
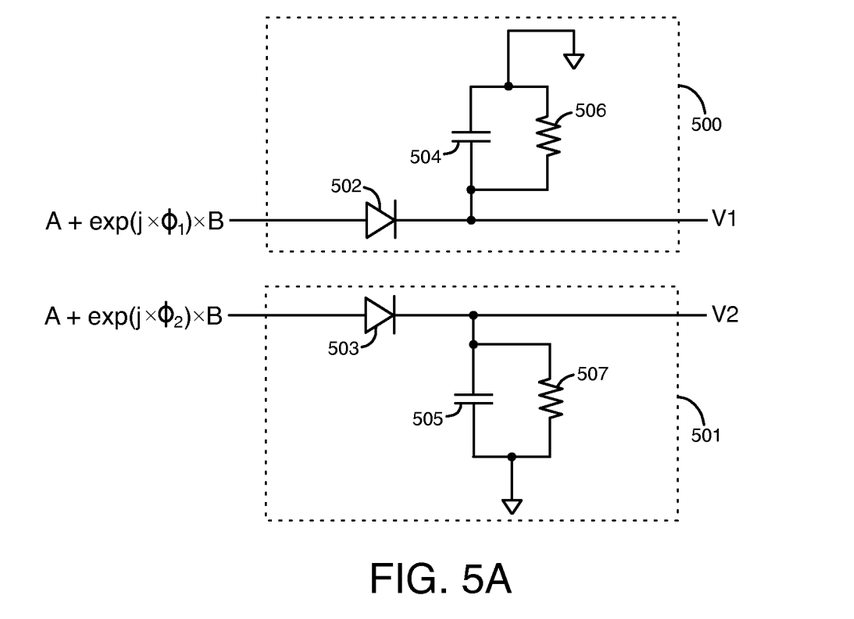
FIG. 5A illustrates examples of envelope detector circuits that can be used to implement the amplitude/power detector circuits in the PLL of FIG. 2D.

FIG. 5A illustrates examples of envelope detector circuits 500 and 501 that can be used to implement amplitude/power detector circuits 212 and 213, respectively, in PLL 210 of FIG. 2D. Envelope detector circuit 500 includes diode 502, capacitor 504, and resistor 506. Envelope detector circuit 501 includes diode 503, capacitor 505, and resistor 507.

Capacitor 504 and resistor 506 are coupled in parallel between the cathode of diode 502 and a node that is at a ground voltage. Envelope detector circuit 500 generates the voltage signal V1 that equals the magnitude of the peak amplitude of periodic signal $A+\exp(j\times\phi_1)\times B$. The magnitude of the peak amplitude of periodic signal $A+\exp(j\times\phi_1)\times B$ is indicative of the power of periodic signal $A+\exp(j\times\phi_1)\times B$.

Capacitor 505 and resistor 507 are coupled in parallel between the cathode of diode 503 and the ground node. Envelope detector circuit 501 generates the voltage signal V2 that equals the magnitude of the peak amplitude of periodic signal $A+\exp(j\times\phi_2)\times B$. The magnitude of the peak amplitude of periodic signal $A+\exp(j\times\phi_2)\times B$ is indicative of the power of periodic signal $A+\exp(j\times\phi_2)\times B$.

Figure 5B:
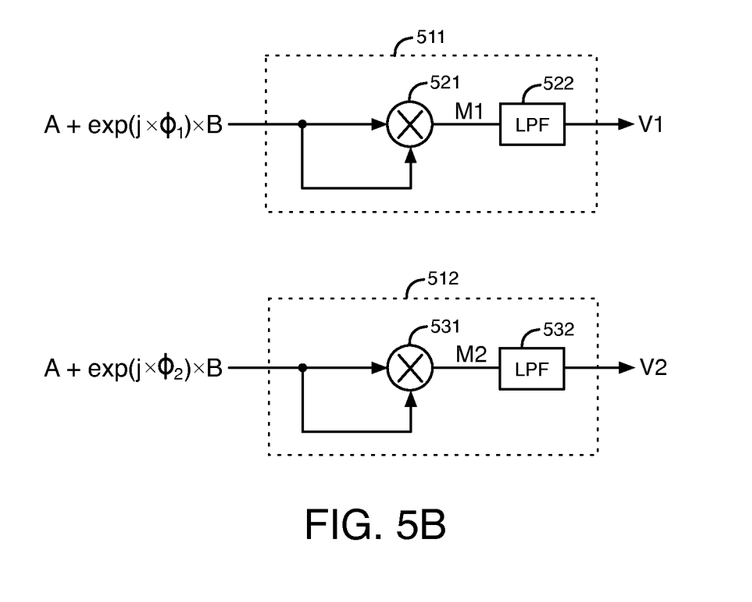
FIG. 5B illustrates examples of self-mixer circuits that can be used to implement the amplitude/power detector circuits in the PLL of FIG. 2D.

According to alternative embodiments, amplitude/power detector circuits 212-213 can be implemented using self-mixer circuits that generate signals V1 and V2. FIG. 5B illustrates examples of self-mixer circuits 511 and 512 that can be used to implement amplitude/power detector circuits 212 and 213, respectively, in PLL 210 of FIG. 2D. Self-mixer circuit 511 includes mixer circuit 521 and low pass filter circuit 522. Self-mixer circuit 512 includes mixer circuit 531 and low pass filter circuit 532.

Mixer circuit 521 multiplies $A+\exp(j\times\phi_1)\times B$ by itself to generate signal M1. Low pass filter (LPF) 522 filters out the high frequency components of signal M1 to generate a low frequency voltage signal V1 that is proportional to the magnitude of the peak amplitude of periodic signal $A+\exp(j\times\phi_1)\times B$. Voltage signal V1 is provided to the non-inverting input of comparator 218.

Mixer circuit 531 multiplies $A+\exp(j\times\phi_2)\times B$ by itself to generate signal M2. Low pass filter (LPF) 532 filters out the high frequency components of signal M2 to generate a low frequency voltage signal V2 that is proportional to the magnitude of the peak amplitude of periodic signal $A+\exp(j\times\phi_2)\times B$. Voltage signal V2 is provided to the inverting input of comparator 218.

Figure 6:
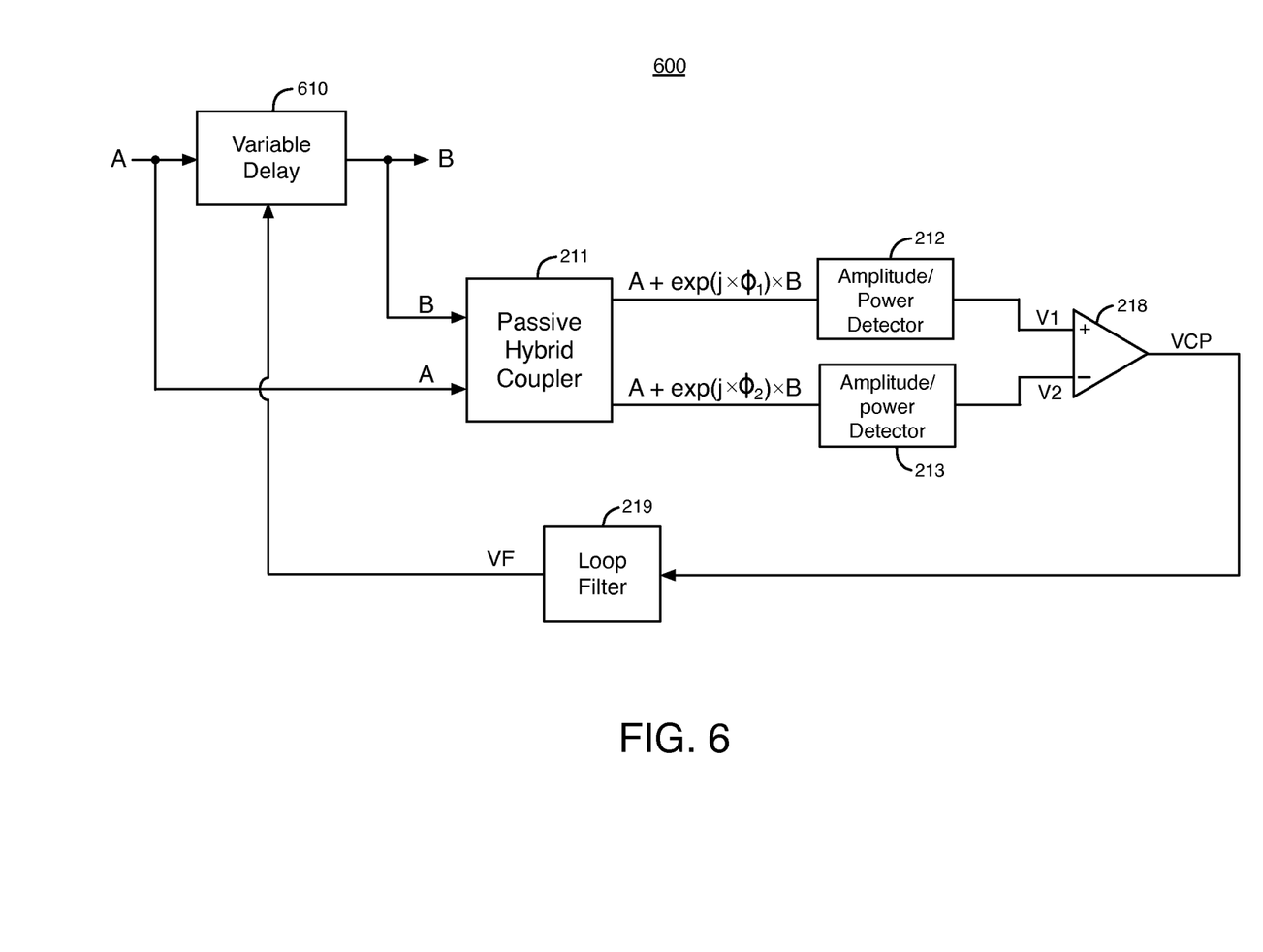
FIG. 6 illustrates an example of a delay-locked loop (DLL) circuit that is capable of generating a high frequency periodic output signal using an embodiment of the phase detector circuit of FIG. 2A.

FIG. 6 illustrates an example of a delay-locked loop (DLL) circuit 600 that is capable of generating a high frequency periodic signal B using an embodiment of the phase detector circuit of FIG. 2A. DLL circuit 600 includes passive hybrid coupler 211, amplitude/power detector circuits 212-213, comparator circuit 218, loop filter circuit 219, and variable delay circuit 610.

Passive hybrid coupler 211, amplitude/power detector circuits 212-213, comparator circuit 218, and loop filter circuit 219 function as described above with respect to FIG. 2D. The output signal(s) VF of loop filter circuit 219 are transmitted to one or more control inputs of variable delay circuit 610. Variable delay circuit 610 delays periodic signal A to generate periodic signal B. Thus, in DLL 600, signal B is a delayed version of signal A, and signals A and B have the same frequency. Variable delay circuit 610 varies the delay that it provides to signal B relative to signal A based on changes in filtered signal(s) VF. Periodic signal B is transmitted from an output of variable delay circuit 610 to an input of passive hybrid coupler 211. Variable delay circuit 610 can be, for example, a voltage-controlled delay chain, a phase interpolator circuit, or any other suitable adjustable delay circuit.

Figure 7A:
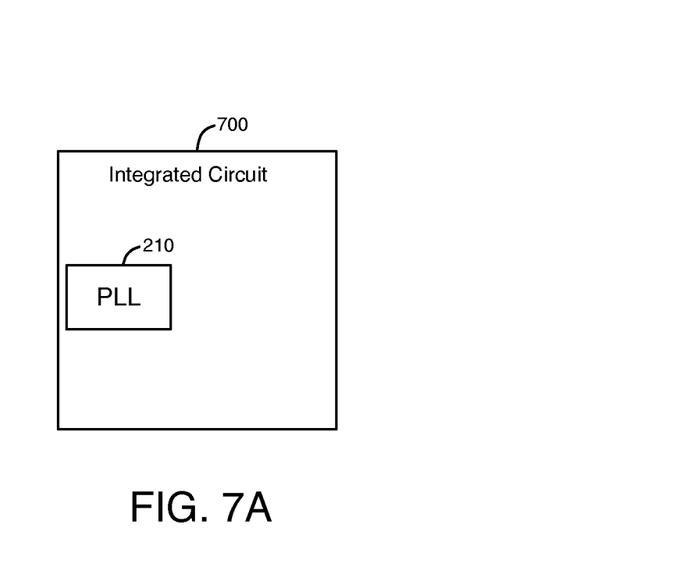
FIG. 7A illustrates an example of a portion of an integrated circuit that contains the PLL of FIG. 2D.
Figure 7B:
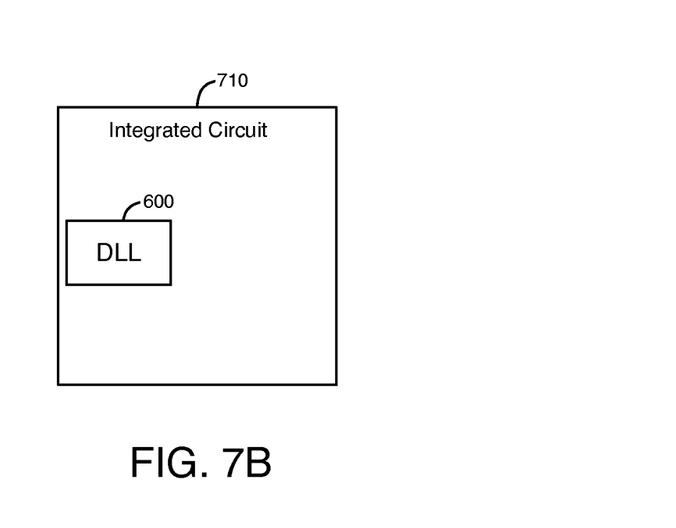
FIG. 7B illustrates an example of a portion of an integrated circuit that contains the DLL of FIG. 6.

The phase detectors, PLLs, and DLLs described herein can be fabricated in any suitable integrated circuit (IC), such as, for example, a memory IC, a controller IC, a memory controller IC, a processor IC, an analog IC, a digital IC, a programmable IC, etc. FIG. 7A illustrates an example of a portion of an integrated circuit 700 that contains PLL 210 shown in FIG. 2D. FIG. 7B illustrates an example of a portion of an integrated circuit 710 that contains DLL 600 shown in FIG. 6. In each of these embodiments, the integrated circuit can be a memory device having the PLL or DLL as appropriate to synch to an external timing reference for purposes of mesochronous communications. If desired, this integrated circuit can be further configured as a dynamic random access memory ("DRAM") instantiated in a low power application, such as a mobile device (e.g., a cell phone or multifunction device). Alternatively, this integrated circuit can also represent a memory controller, for example, for interfacing with memory devices such as DRAM integrated circuits. In still another embodiment, this integrated circuit can be used as a wireless communication transceiver used in a wireless device. This integrated circuit may be coupled to one or more antennas, and if desired, may have one or more antennas integrated together with the integrated circuit, via a common piece of silicon or mounted in a common package.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. A circuit comprising:
a passive combining circuit, containing no active circuit components, that receives first and second periodic signals and that generates third and fourth periodic signals in response to the first and the second periodic signals, wherein the passive combining circuit causes the third periodic signal to be based on a combination of the first periodic signal and the second periodic signal in a manner that imparts a first relative phase shift, wherein the passive combining circuit causes the fourth periodic signal to be based on a combination of the first periodic signal and the second periodic signal in a manner that imparts a second relative phase shift,
a power detector circuit, comprised entirely of passive circuit components, that generates a first and second power signal from the third and fourth periodic signals respectively, wherein the first and second power signals are indicative of either a power of the third periodic signal and a power of the fourth periodic signal or an amplitude of the third periodic signal and an amplitude of the fourth periodic signal, respectively;
a comparison circuit that compares the first power signal to the second power signal to generate an output signal; and
a loop circuit that generates the second periodic signal, and wherein the loop circuit varies a phase of the second periodic signal based on changes in the output signal of the comparison circuit.

2. The circuit of claim 1 wherein the circuit is in an integrated circuit.

3. The circuit of claim 1 wherein the loop circuit comprises a loop filter coupled to an oscillator, wherein the loop filter receives the output signal of the comparison circuit, and wherein the circuit is a phase-locked loop.

4. The circuit of claim 1 wherein the loop circuit comprises a loop filter coupled to a variable delay circuit, wherein the loop filter receives the output signal of the comparison circuit, and wherein the circuit is a delay-locked loop.

5. The circuit of claim 1 wherein the passive combining circuit comprises a passive hybrid coupler that generates the third and the fourth periodic signals in response to the first and the second periodic signals.

6. The circuit of claim 5 wherein the passive hybrid coupler comprises four transmission lines coupled in a ring structure.

7. The circuit of claim 5 wherein the passive hybrid coupler comprises first, second, third, and fourth inductors coupled in a ring structure, a first capacitor coupled to the first and the second inductors, a second capacitor coupled to the second and the third inductors, a third capacitor coupled to the third and the fourth inductors, and a fourth capacitor coupled to the fourth and the first inductors.

8. The circuit of claim 1 wherein the power detector circuit comprises:
a first envelope detector circuit that generates the first power signal; and
a second envelope detector circuit that generates the second power signal.

9. The circuit of claim 8 wherein the first envelope detector circuit comprises a first diode, a first resistor, and a first capacitor coupled in parallel with the first resistor and coupled to the first diode, and wherein the second envelope detector circuit comprises a second diode, a second resistor, and a second capacitor coupled in parallel with the second resistor and coupled to the second diode.

10. The circuit of claim 1 wherein the passive combining circuit causes the third periodic signal to be based on a combination of the first periodic signal and the second periodic signal in a manner that imparts a relative phase shift of approximately 90 degrees, and wherein the passive combining circuit causes the fourth periodic signal to be based on a combination of the first periodic signal and the second periodic signal in a manner that imparts a relative phase shift of approximately 270 degrees.

11. The circuit of claim 1, wherein the comparison circuit comprises a digital comparator.

12. The circuit of claim 1, wherein the comparison circuit comprises an analog comparator.

13. The circuit of claim 12, wherein the analog comparator generates an output approximately proportional to a difference between the first and second power signals.

14. A method comprising:
    combining, by a passive combining circuit, first and second periodic signals to generate a third periodic signal that is based on a first function of the first periodic signal and the second periodic signal, and a fourth periodic signal that is based on a second function of the first periodic signal and the second periodic signal;
    generating, by a power detector circuit comprised entirely of passive circuit components, a first and second power signal from the third and fourth periodic signals respectively, wherein the first and second power signals are indicative of either a power of the third periodic signal and a power of the fourth periodic signal or an amplitude of the third periodic signal and an amplitude of the fourth periodic signal, respectively,
    comparing, by a comparison circuit, the first power signal to the second power signal to generate a phase comparison signal that varies based on changes in phase difference between the first and the second periodic signals; and
    varying a phase of the second periodic signal based on changes in the phase comparison signal using a loop circuit that generates the second periodic signal.

15. The method of claim 14, wherein combining the first and second periodic signals to generate third and fourth periodic signals comprises using a passive hybrid coupler.

16. The method of claim 15, wherein the passive hybrid coupler comprises four transmission lines coupled in a ring structure.

17. The method of claim 15, wherein the passive hybrid coupler comprises first, second, third, and fourth inductors coupled in a ring structure.

18. The method of claim 14, wherein the second periodic signal is generated by an oscillator circuit in a phase-locked loop circuit.

19. The method of claim 14, wherein the second periodic signal comprises a feedback signal in a delay-locked loop circuit.

* * * * *